(12) United States Patent
Jiong et al.

(10) Patent No.: US 6,750,750 B2
(45) Date of Patent: Jun. 15, 2004

(54) VIA/LINE INDUCTOR ON SEMICONDUCTOR MATERIAL

(75) Inventors: Zhang Jiong, Singapore (SG); Yi Min Wang, Singapore (SG); Shao-fu Sanford Chu, Singapore (SG)

(73) Assignee: Chartered Semiconductor Manufacturing Ltd. (SG)

( * ) Notice: Subject to any disclaimer, the term of this patent is extended or adjusted under 35 U.S.C. 154(b) by 70 days.

(21) Appl. No.: 10/040,765

(22) Filed: Dec. 28, 2001

(65) Prior Publication Data

US 2003/0122649 A1 Jul. 3, 2003

(51) Int. Cl.$^7$ ................................................ H01F 5/00
(52) U.S. Cl. ........................ 336/200; 336/232; 29/602.1
(58) Field of Search .......................... 336/83, 192, 199, 336/200, 206–208, 232; 29/602.1, 603.13, 603.14, 603.15, 603.18; 438/706–724

(56) References Cited

U.S. PATENT DOCUMENTS 6,395,637 B1 * 5/2002 Park et al. .................. 438/706

\* cited by examiner

*Primary Examiner*—Tuyen T. Nguyen
(74) *Attorney, Agent, or Firm*—Mikio Ishimaru

(57) ABSTRACT

A spiral inductor, and manufacturing method therefore, is provided including a substrate and an inductor dielectric layer over the substrate having a spiral opening provided therein. A spiral inductor is in the spiral opening with the spiral inductor including a plurality of parallel spiral vias connected together at center proximate and center distal ends of the spiral inductor.

10 Claims, 2 Drawing Sheets

VIA/LINE INDUCTOR ON SEMICONDUCTOR MATERIAL

TECHNICAL FIELD

The present invention relates generally to integrated circuits and more particularly to on-chip silicon-based inductors.

BACKGROUND OF THE INVENTION

Increasing demands for personal mobile communications equipment have motivated recent research activities to focus on the development of inexpensive, small size, low power consumption, and low noise level systems. To satisfy these requirements, one of the most important and indispensable circuit components is the on-chip silicon-based inductor.

As a result, miniaturization of the inductor on silicon has become a current key research area and extensive work has been done in this area. However, despite efforts by many researchers having skill in the art, achieving high performance on-chip inductors, i.e., high quality factor (Q), still remains a major problem especially when radio frequency integrated circuits (RFICs) are built on silicon.

In addition, high dynamic resistance of metal lines at GHz frequency ranges further degrades the inductor performance in CMOS technology as compared to those fabricated in monolithic microwave integrated circuits (MMICs).

Many fabricating techniques, processes, and materials have been proposed to improve the performance of on-chip inductors. Tedious processing techniques such as etching away the silicon substrate under the inductor have been introduced to remove the substrate parasitic effects completely. Despite achieving good results, industries are reluctant to adopt such a technique because of reliability issues such as packaging yield, as well as long-term mechanical stability.

The most critical factor hindering the performance of silicon-based inductors is the high resistive aluminum-copper (AlCu) interconnects used in silicon processes.

In comparison, thicker and less resistive gold (Au) metalization together with lossless substrate in gallium arsenide (GaAs) technology permits high performance inductors to be fabricated easily. To overcome high metalization resistance, a popular technique is to have the layers of metal stacked together, thereby achieving a high Q inductor.

Another possible alternative is to use an active inductor. In an active inductor high Q factor and inductance can be achieved in a really small silicon area. However, such an approach suffers from high power consumption and high noise levels that are not acceptable for low power and high frequency applications. In addition, performance of active inductors are very sensitive and dependent upon the inductor's biasing circuitry, making it time consuming and tedious to design.

A further possible alternative is to increase the thickness of metal because the Q value of an inductor is dependent upon its interior resistance (r) to the AC (alternate current) signal and increasing the thickness decreases the interior resistance. Unfortunately, the thickness of the metal cannot be increased without limit before encountering technological difficulties in lithography and etch.

As a result of the above, the simplest and most commonly used on-chip inductors are planar silicon-based spiral inductors, which require careful layout optimization techniques to improve performance.

Solutions to these problems have been long sought, but have long eluded those skilled in the art.

DISCLOSURE OF THE INVENTION

The present invention provides a spiral inductor including a substrate and an inductor dielectric layer over the substrate having a spiral opening provided therein. A spiral inductor is in the spiral opening with the inductor including a plurality of parallel spiral vias connected together at center proximate and center distal ends of the spiral inductor. The parallel spiral vias increase the surface area of the spiral inductor by over 70% and increase the high quality factor (Q) by over 70% compared to a conventional spiral inductor.

The present invention provides a method of manufacturing a spiral inductor by providing a substrate, forming an inductor dielectric layer over the substrate, and forming a spiral opening in the inductor dielectric layer. A spiral inductor is formed in the spiral opening with a plurality of parallel spiral vias connected together at center proximate and center distal ends of the spiral inductor. The parallel spiral vias increase the surface area of the spiral inductor by over 70% and increase the Q by over 70% compared to a conventional spiral inductor.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
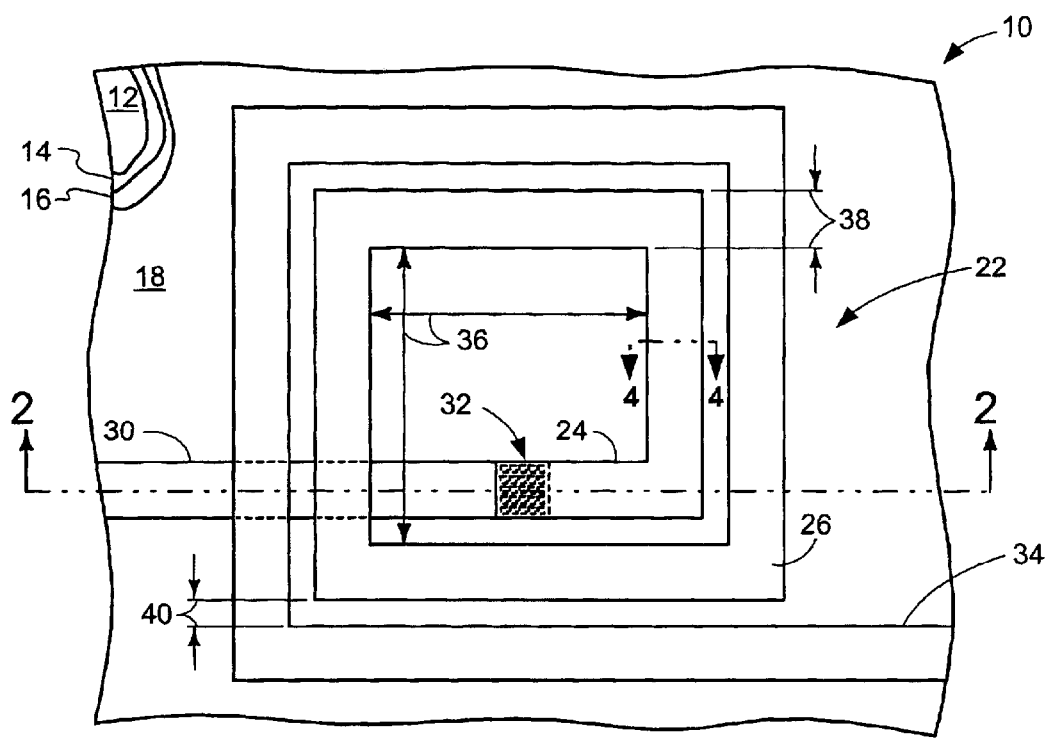
FIG. 1 (PRIOR ART) is a cross-sectional view of a prior art spiral inductor along line 1—1 of FIG. 2 (PRIOR ART)
Figure 2:
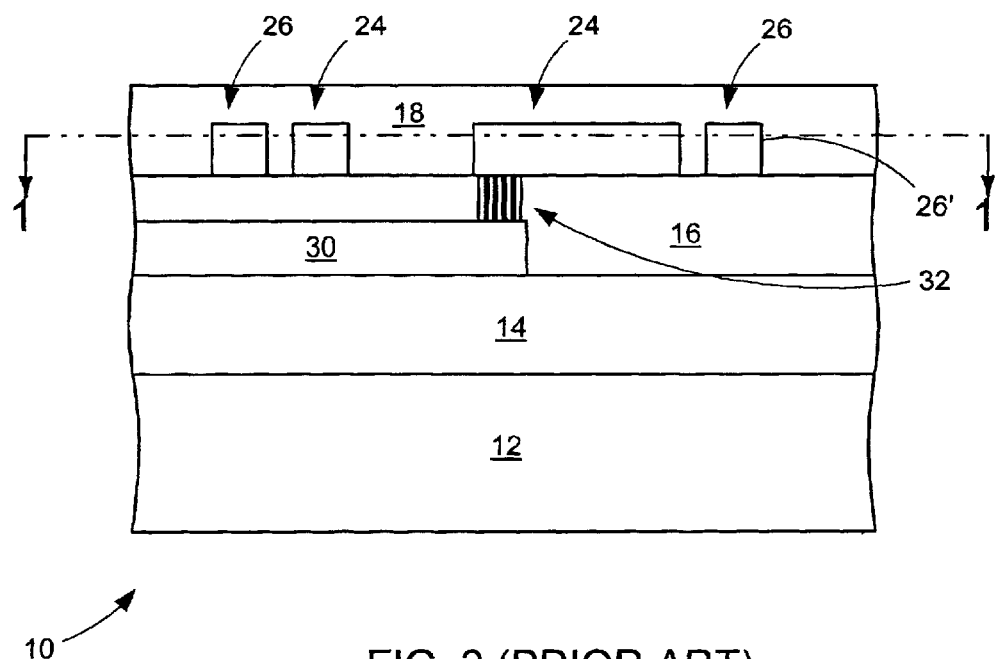
FIG. 2 (PRIOR ART) is a cross-sectional view of the prior art spiral inductor along line 2—2 of FIG. 1 (PRIOR ART)

Referring now to FIG. 1 (PRIOR ART), therein is shown a cross-sectional view of a prior art on-chip inductor 10 along line 1—1 of FIG. 2 (PRIOR ART). A substrate 12, of a material such as silicon, has a plurality of dielectric layers formed thereon of a material such as silicon dioxide. Sequentially, a field dielectric layer 14 (such as a field oxide), a connecting interlayer dielectric (ILD) layer 16 (such as a silicon oxide), and an inductor ILD layer 18 are formed over the substrate 12. Embedded within the inductor ILD layer 18 is a prior art spiral inductor 22.

The term "over" as used in herein is defined vertically above a horizontal plane parallel to the conventional surface of a wafer on which the on-chip inductor is formed regardless of the orientation of the wafer. Terms, such as "on", "below", "higher", "lower", "above", and "under", are defined with respect to the horizontal plane.

The term "processed" or "forming" as used herein to refer to the formation of vias and turns includes conventional semiconductor deposition of conductor deposition, photoresist, hard and soft mask photolithography, etch, and strip, as appropriate.

In the prior art, the prior art spiral inductor 22 is a two turn inductor. In FIG. 1 (PRIOR ART), are shown first and second turns 24 and 26.

A first connecting portion 30 having connecting vias 32 connects to the prior art spiral inductor 22 at one end and a second connecting portion 34 connects at the other end.

The first turn 24 has an inner diameter 36, a width 38 which is common to each of the turns, and a spacing 40 between each of the turns. The first connecting portion 30 passes under the two turns and thus is also referred to as an underpass 30.

Referring now to FIG. 2 (PRIOR ART), therein is shown a cross-sectional view of the prior art spiral inductor 10 along line 2—2 of FIG. 1 (PRIOR ART). The substrate 12 has the field dielectric layer 14 upon which a conductive material is deposited and patterned to form the underpass 30.

The connecting ILD layer 16 is then deposited over the underpass 30. One or more first via openings are formed in the connecting ILD layer 16 connected to the underpass 30.

A conductive material layer is deposited on the connecting ILD layer 16 and processed to form the prior art spiral inductor 22. The first via openings are also filled with conductive material to form connecting vias 32.

Figure 3:
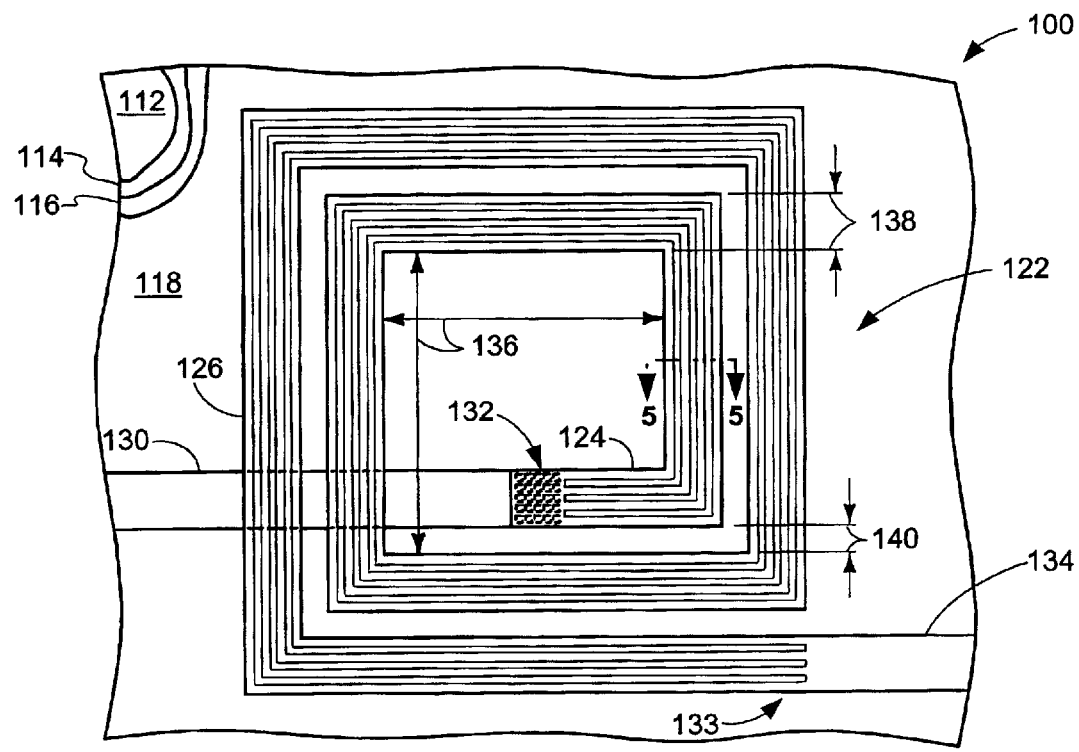
FIG. 3 is shown a cross-sectional view similar to FIG. 1 (PRIOR ART) of a via/line spiral inductor of the present invention.

Referring now to FIG. 3, therein is shown a cross-sectional view similar to FIG. 1 (PRIOR ART) of a via/line spiral inductor 100 of the present invention. A substrate 112, of a material such as silicon, has a plurality of dielectric layers formed thereon of a material such as silicon dioxide. Sequentially, a field dielectric layer 114 (such as a field oxide), a connecting interlayer dielectric (ILD) layer 116 (such as a silicon oxide), and an inductor ILD layer 118 are formed over the substrate 112. Embedded within the dielectric layers is a via/line spiral inductor 122.

The via/line spiral inductor 122 is shown as being square spiral but it may also be circular spiral. Similarly, the via/line spiral inductor 122 can be a spiral, which is either clockwise or counter clockwise as viewed from above.

In the described embodiment, the via/line spiral inductor 122 is a two turn inductor. In FIG. 3, are shown first and second turns 124 and 126.

Individually, the turns can be flat as shown or circular, and can be made from any conductive material including copper.

A first connecting portion 130 having connecting vias 132 connects to the via/line spiral inductor 122 at one end and a second connecting portion 134 having connecting vias 133 connects at the other end.

The first turn 126 has an inner diameter 136, a width 138 which is common to each of the turns, and a spacing 140 between each of the turns. The first connecting portion 130 passes under the two turns and thus is also referred to as an underpass 130. It will be understood that the turns may be connected the first and second connecting portions 130 as shown or with the first connecting portion 130 on top of the turns.

Figure 4:
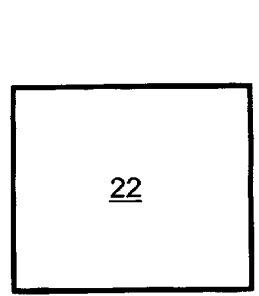
FIG. 4 (PRIOR ART) is a cross-sectional view of the prior art spiral inductor along line 4—4 of FIG. 1.

Referring now to FIG. 4 (PRIOR ART), therein is a cross-sectional view of the prior art spiral inductor 22 along line 4—4 of FIG. 1. The cross-section is generally rectangular and for purposes of comparison, the width is 6.0 μm and the thickness is 2.0 μm.

Figure 5:
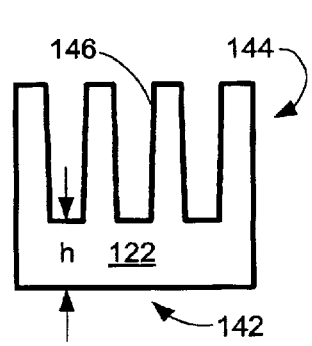
FIG. 5 is a cross-sectional view of the via/line spiral inductor of the present invention along line 5—5 of FIG. 3.

Referring now to FIG. 5, therein is shown a cross-sectional view of the via/line spiral inductor 122 of the present invention along line 5—5 of FIG. 3.

In the present invention, it was realized that the high quality factor (Q) value of an inductor is dependent upon its interior resistance (r) to the AC (alternate current) signal. With lower interior resistance, the Q could be increased.

In analyzing how to reduce interior resistance, it was realized that interior resistance did not have to be reduced. Since current flow along a conductor is a surface phenomenon or "skin-effect", it was determined that overall resistance was the problem and that the overall resistance could be reduced by increasing the surface area of the inductor.

In analyzing how to manufacture an increased surface area inductor using existing processes, several approaches appeared promising.

In the embodiment of the via/line spiral inductor 122 shown in FIG. 5, a line 142 is deposited and parallel vias 144 are formed on the line 142 by a conventional aluminum via/line process. This structure forms additional surface area 146.

The line 142 has a thickness "h". If h=0, the parallel vias 144 are equivalent to separate, parallel lines or vias connected at their center proximate and distal ends. It will be understood that the maximum surface area 146 is obtained when h is slightly above zero.

Figure 6:
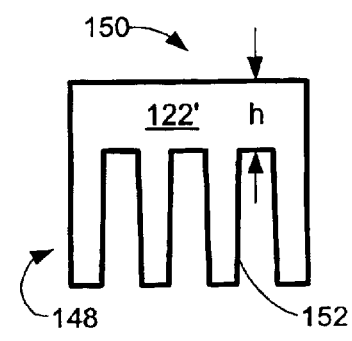
FIG. 6 is a cross-sectional view similar to FIG. 5 of an alternate embodiment via/line spiral inductor of the present invention.

Referring now to FIG. 6, therein is shown a cross-sectional view similar to FIG. 5 of an alternate embodiment line spiral inductor 122' of the present invention.

In the embodiment of a via/line spiral inductor 122' shown in FIG. 6, parallel vias 148 and a line 150 are formed simultaneously in a dual damascene process and can be made of copper. This structure forms additional surface area 152.

The line 150 has a thickness "h". If h=0, the parallel vias 148 are equivalent to separate, vertically parallel lines or vias connected together at their center proximate and distal ends. It will be understood that the maximum surface area 152 is obtained when h is slightly above zero. The h can be established by chemical mechanical polishing of the top surface of the inductor 122' after deposition.

For purposes of comparison with the prior art spiral inductor 22, when the width is 6.0 μm and the thickness is 2.0 μm as in the prior art, a four 1.5 μm wide vias via/line spiral inductor 122 or 122' will have approximately a surprising increase in surface area of over 70%. A 70% increase in surface area will eqauate to approximately a 70% increase in Q.

While the invention has been described in conjunction with a specific best mode, it is to be understood that many alternatives, modifications, and variations will be apparent to those skilled in the art in light of the a foregoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of manufacturing a spiral inductor comprising:

providing a substrate;

forming an inductor dielectric layer over the substrate;

forming a spiral opening in the inductor dielectric layer;

forming a spiral inductor in the spiral opening, forming the spiral inductor including:

forming a plurality of vias in the cross-section of the spiral inductor, the plurality of vias commonly connected at top or bottom and unconnected respectively at bottom or top, to define parallel spiral vias connected together at center proximate and center distal ends of the spiral inductor.

2. The method as claimed in claim 1 wherein:

forming the spiral inductor includes:
   forming a spiral line in the spiral opening; and
   forming the plurality of parallel spiral vias above the spiral line and integral therewith.

3. The method as claimed in claim 1 wherein:

forming the spiral inductor includes:
   forming a spiral line over the plurality of parallel spiral vias and integral therewith.

4. The method as claimed in claim 1 including:

forming a first connecting portion;

forming connecting via between the first connecting portion and the center proximate end of the spiral inductor; and forming a second connecting portion connected to the center distal end of the spiral inductor.

5. The method as claimed in claim 1 wherein:

forming the spiral opening forms a multi-turn spiral from a group consisting of square, rectangular, and circular spirals.

6. A method of manufacturing a spiral inductor comprising:

providing a substrate;

forming a field dielectric layer over the substrate;

forming an inductor dielectric layer over the field dielectric layer;

forming a spiral opening in the inductor dielectric layer;

forming a spiral inductor in the spiral opening, forming the spiral inductor including:
   forming a plurality of vias in the cross-section of the spiral inductor, the plurality of vias commonly connected at top or bottom and unconnected respectively at bottom or top, to define parallel spiral vias connected together at center proximate and center distal ends of the spiral inductor:

forming a first connecting portion connected to the center proximate end of the spiral inductor; and forming a second connecting portion connected to the center distal end of the spiral inductor.

7. The method as claimed in claim 6 wherein:

forming the spiral inductor includes:
   forming a spiral line in the spiral opening connected together to the parallel spiral vias at the center proximate and the center distal ends of the spiral inductor; and
   forming the plurality of parallel spiral vias above the spiral line and integral therewith.

8. The method as claimed in claim 6 wherein:

forming the spiral inductor includes:
   forming a spiral line over the plurality of parallel spiral vias and integral therewith, the spiral line connected together to the parallel spiral vias at the center proximate and the center distal ends of the spiral inductor.

9. The method as claimed in claim 6 including:

forming a connecting portion dielectric over the field dielectric and under the inductor dielectric layer;

forming an opening in the connecting portion for the first connecting portion;

forming connecting via between the first connecting portion and the center proximate end of the spiral inductor; and forming a second connecting portion connected to the center distal end of the spiral inductor.

10. The method as claimed in claim 6 wherein:

forming the spiral opening forms a multi-turn spiral from a group consisting of square, rectangular, and circular spirals.

* * * * *

UNITED STATES PATENT AND TRADEMARK OFFICE
CERTIFICATE OF CORRECTION

PATENT NO.     : 6,750,750 B2
DATED          : June 15, 2004
INVENTOR(S)    : Zhang et al.

It is certified that error appears in the above-identified patent and that said Letters Patent is hereby corrected as shown below:

Title page,
Item [12], please delete "Jiong et al." and insert therefore -- Zhang et al. --
Item [75], please delete "Zhang Jiong" and insert therefore -- Jiong Zhang --

Signed and Sealed this

Twenty-third Day of November, 2004

JON W. DUDAS
*Director of the United States Patent and Trademark Office*